(12) United States Patent
Lo et al.

(10) Patent No.: US 7,619,272 B2
(45) Date of Patent: Nov. 17, 2009

(54) BI-AXIAL TEXTURING OF HIGH-K DIELECTRIC FILMS TO REDUCE LEAKAGE CURRENTS

(75) Inventors: Wai Lo, Lake Oswego, OR (US);
Sey-Shing Sun, Portland, OR (US);
Wilbur Catabay, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 699 days.

(21) Appl. No.: 11/007,392

(22) Filed: Dec. 7, 2004

(65) Prior Publication Data

US 2006/0118919 A1 Jun. 8, 2006

(51) Int. Cl.
*H01L 29/76* (2006.01)

(52) U.S. Cl. ............... 257/310; 257/410; 257/E29.015

(58) Field of Classification Search .............. 257/64, 257/410, 310, E21.639, E21.625, E29.015; 438/216
See application file for complete search history.

(56) References Cited

U.S. PATENT DOCUMENTS

| | | | | |
|---|---|---|---|---|
| 5,520,953 | A * | 5/1996 | Ovshinsky et al. | 427/62 |
| 5,650,378 | A * | 7/1997 | Iijima et al. | 505/473 |
| 5,739,086 | A * | 4/1998 | Goyal et al. | 505/473 |
| 6,096,434 | A * | 8/2000 | Yano et al. | 428/446 |
| 6,114,287 | A * | 9/2000 | Lee et al. | 505/473 |
| 6,190,752 | B1 * | 2/2001 | Do et al. | 428/141 |
| 6,632,539 | B1 * | 10/2003 | Iijima et al. | 428/472 |
| 6,716,796 | B1 * | 4/2004 | Iijima et al. | 505/238 |
| 6,849,580 | B2 * | 2/2005 | Norton et al. | 505/237 |
| 6,998,028 | B1 * | 2/2006 | Selvamanickam | 204/192.11 |
| 7,261,776 | B2 * | 8/2007 | Rupich et al. | 117/89 |
| 7,385,264 | B2 * | 6/2008 | Muraoka | 257/410 |
| 2004/0224474 | A1 * | 11/2004 | Barth et al. | 438/396 |
| 2005/0196917 | A1 * | 9/2005 | Lian et al. | 438/240 |

FOREIGN PATENT DOCUMENTS

JP 2003179051 A * 6/2003

OTHER PUBLICATIONS

English translation for JP 2003-179051.*

* cited by examiner

*Primary Examiner*—Eugene Lee
(74) *Attorney, Agent, or Firm*—Beyer Law Group LLP

(57) ABSTRACT

The present invention is directed to a method of fabricating a high-K dielectric films having a high degree of crystallographic alignment at grain boundaries of the film. A disclosed method involves providing a substrate and then depositing a material used in forming the high-K dielectric film and also using an ion beam to assist in the preferential formation of crystal lattices having a selected crystallographic orientation. The resultant dielectric film having a high degree of crystallographic alignment at grain boundaries of the film. Another disclosed method involves providing a substrate and then angularly depositing a material onto the substrate in order to assist in the preferential formation of crystal lattices having a selected crystallographic orientation. The resultant dielectric film having a high degree of crystallographic alignment at grain boundaries of the film.

16 Claims, 5 Drawing Sheets

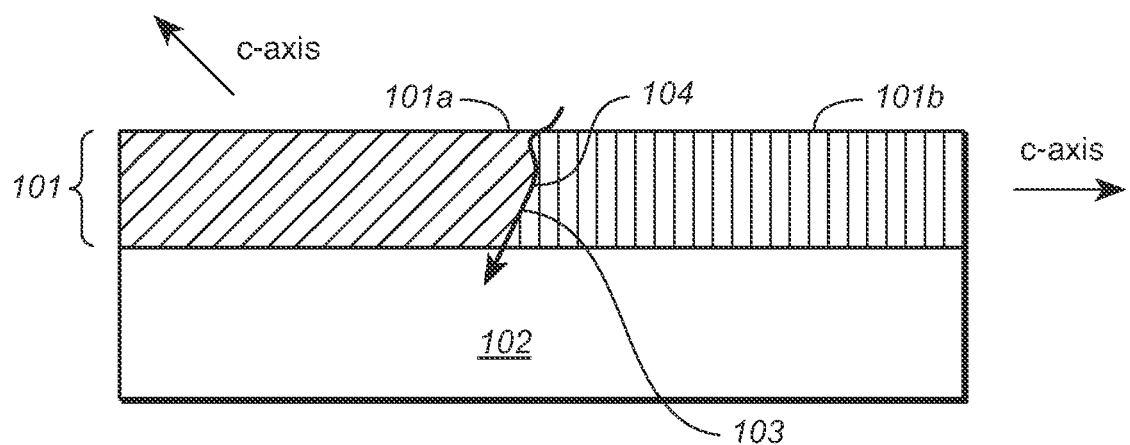
FIG._1a
*(PRIOR ART)*
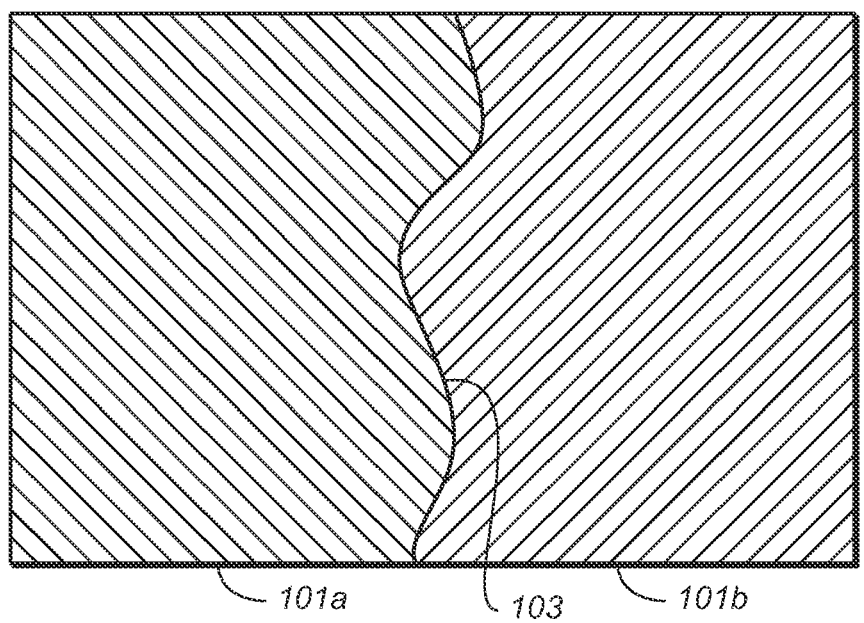
FIG._1b
*(PRIOR ART)*

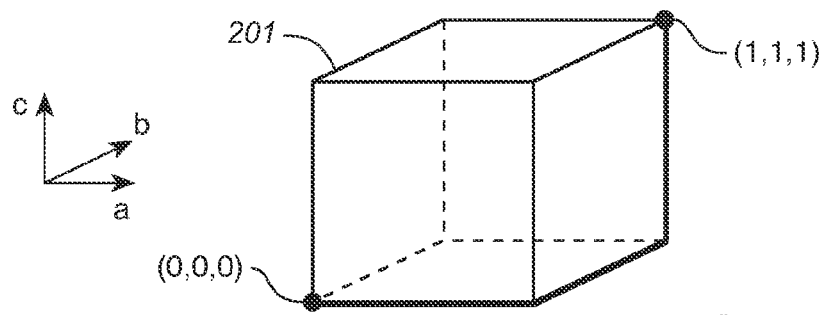
FIG._2
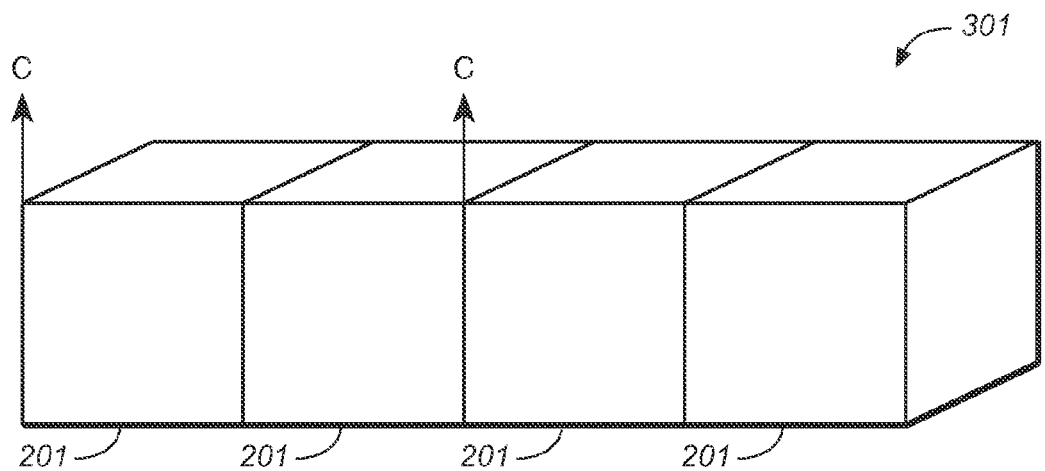
FIG._3
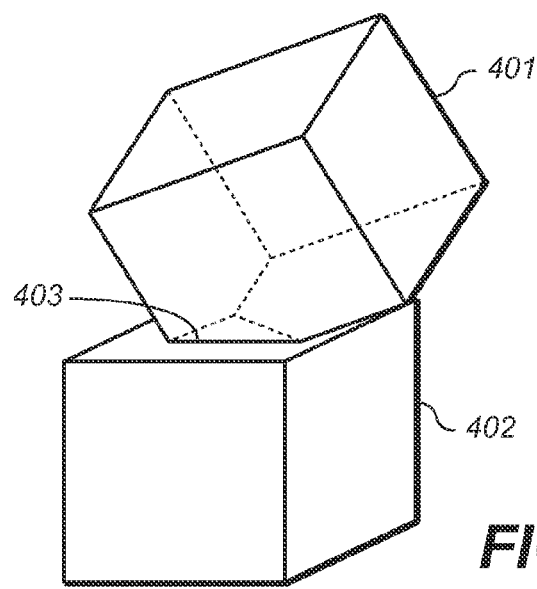
FIG._4

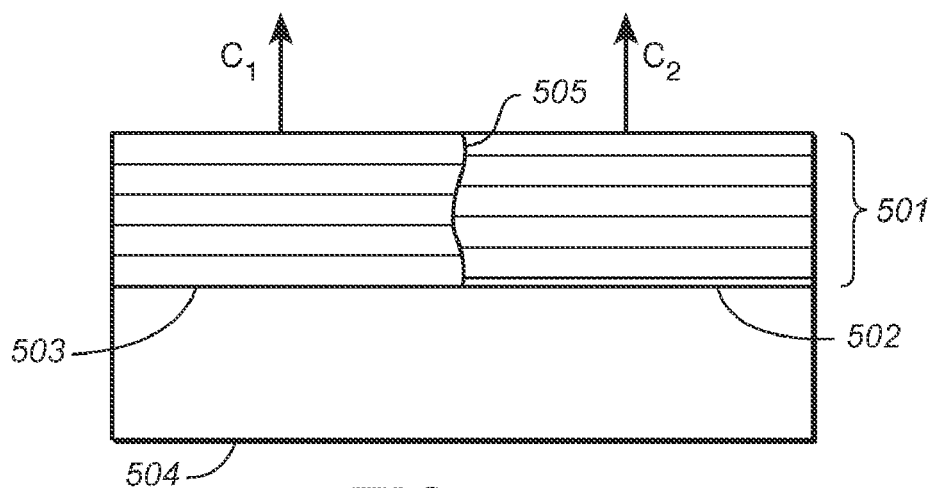
FIG._5a
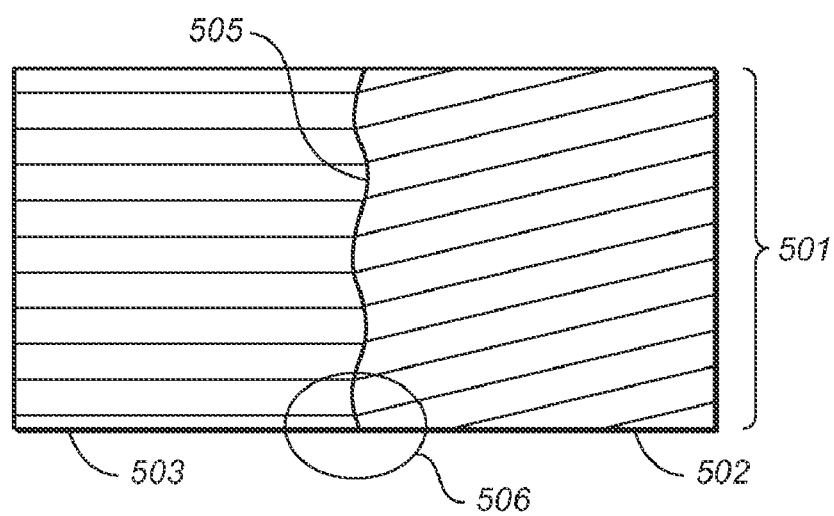
FIG._5b
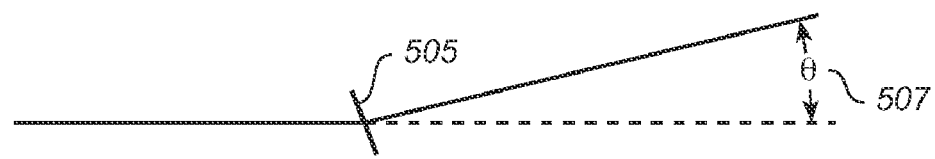
FIG._5c

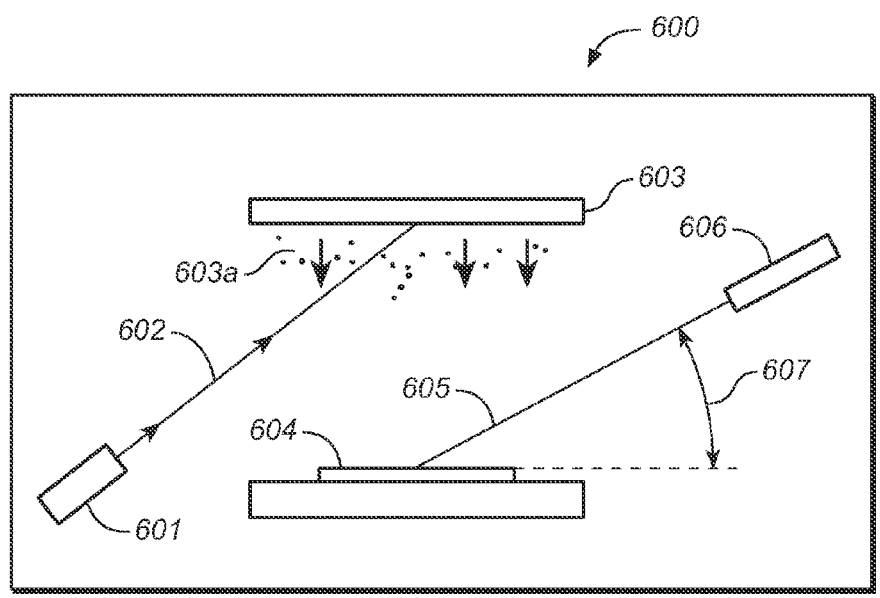
FIG._6
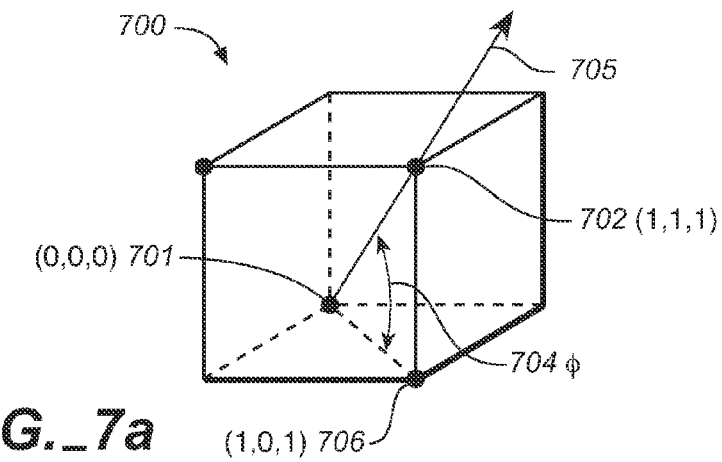
FIG._7a
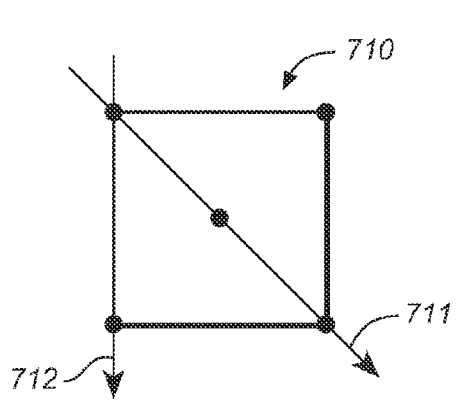
FIG._7b
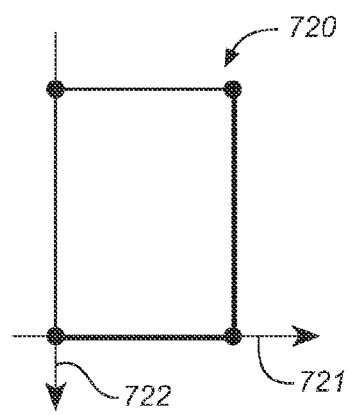
FIG._7c

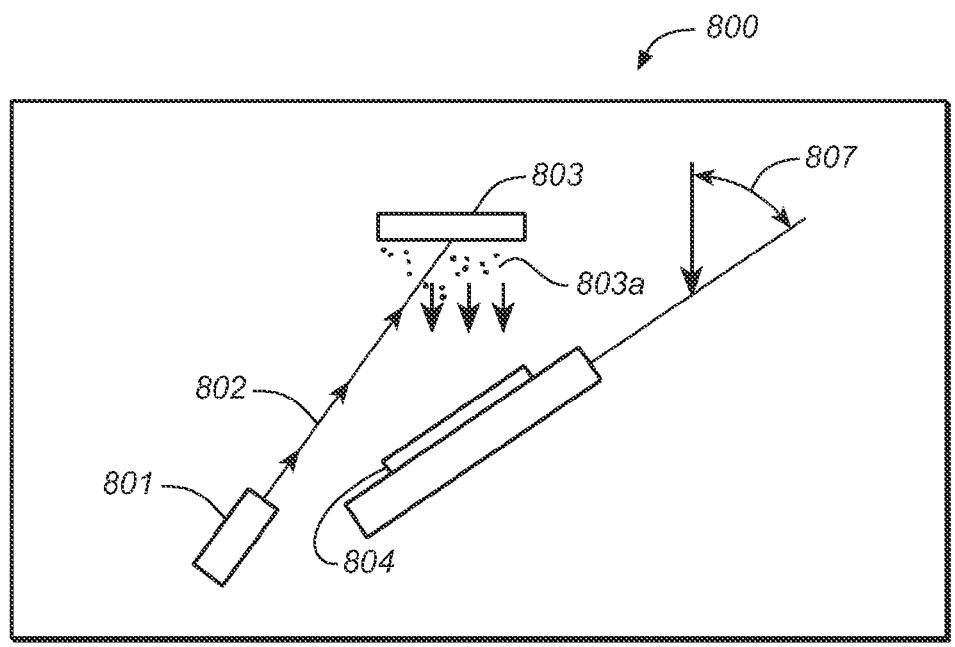
FIG._8
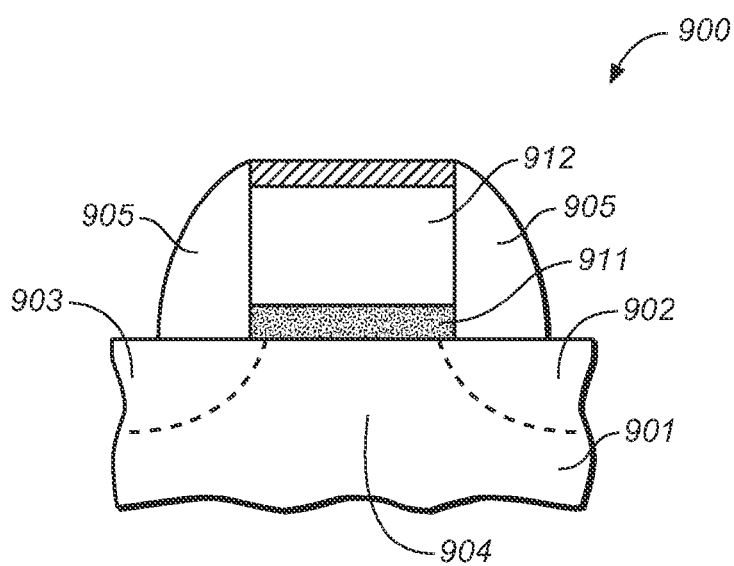
FIG._9

BI-AXIAL TEXTURING OF HIGH-K DIELECTRIC FILMS TO REDUCE LEAKAGE CURRENTS

FIELD OF THE INVENTION

The invention described herein relates generally to semiconductor devices and processing. In particular, the present invention relates to methods, materials, and structures used in forming textured high-K dielectric films on substrates, particularly substantially bi-axially aligned high-K dielectric films for use in semiconductor manufacturing processes.

BACKGROUND OF THE INVENTION

The fabrication and implementation of electronic circuits in IC chips can make use of CMOS processes to fabricate transistors. Such transistors include a gate stack having a gate dielectric layer. Commonly such gate dielectric layers are formed of materials such as silicon dioxide and its derivatives (such as silicon oxynitride). The usefulness of such gate dielectric materials is decreasing for some implementations.

Future generations of CMOS transistors will make increasing use of high-K dielectrics. Such high-K dielectrics offer several advantages. For example, as the size of transistors shrink and their operating voltages are reduced, the thickness of the gate dielectrics (e.g., $SiO_2$ or its derivatives) are reduced accordingly. However, high leakage currents, inevitably result from this thinning dielectric layer. When applied to so-called 65 nm technologies these leakage currents begin to reach unacceptably high levels. For example, in 65 nm technologies, leakage currents on the order of $1-10^2$ A (amps)/$cm^2$ or greater can result using $SiO_2$ or its derivatives in transistor gate dielectric layers. Replacing the $SiO_2$-based dielectrics with high-K dielectrics will enable the physical thickness of the dielectrics to be increased while maintaining a relatively stable gate capacitance. Thus, high-K dielectrics are seen as a potential solution to some of the present gate leakage current problems.

Presently, the thickness of the $SiO_2$-based dielectric gate layers has reached about 12-13 Å in the transistors of 65 nm technology node. Moreover, associated leakage currents have been shown to increase by an order of magnitude for each dielectric layer thickness reduction of 2 Å, which is close to the atomic size of either oxygen or silicon. Thus, the absence of only 1 or 2 atoms seriously increases the possibility of forming local current leakage paths. This raises serious issues concerning the repeatability of dielectric layer fabrication. By using high-K dielectrics this problem can be ameliorated by using thicker dielectric layers. Additionally, the need for extremely thin $SiO_2$-based dielectric layers has highlighted serious reliability issues concerning the metrology techniques used to ensure the in-line control capability of fabrication facilities and techniques. By using thicker high-K dielectrics some of these reliability issues and metrology issues can be addressed.

Although the industry is beginning to acknowledge that high K dielectrics may prove useful, there is no industry-wide conclusion as which material is the best choice for CMOS applications. However, there are some similarities between many classes of high K dielectric materials. In general, crystalline materials can be used to form films with in higher K values, which is desirable, but detrimentally, these crystalline dielectric materials are also typically characterized by higher leakage currents, a situation which defeats the purpose of using high-K dielectrics.

Present processes for fabricating such high-K dielectric layers presents some problems which have not yet been successfully addressed in the industry. As stated above, there is a need for process methods and high-K dielectric films capable of reliable and repeatable fabrication for use in integrated circuits.

SUMMARY OF THE INVENTION

In accordance with the principles of the present invention disclose an improved circuit structure and method for its construction. In one general embodiment, the present invention is directed to a high-K dielectric films formed with a high degree of crystallographic alignment.

In one embodiment, the invention describes an integrated circuit structure having a substrate with a high-K dielectric layer formed thereon. The high-K dielectric film is constructed having a high degree of crystallographic alignment at the grain boundaries of the dielectric film.

In another embodiment the invention describes a transistor having a source, drain, and channel region with a gate stack disposed in the channel region. The bottom of the gate stack includes a gate dielectric layer comprising a high-K dielectric film having a high degree of crystallographic alignment between the grains of the high-K film.

In another embodiment the invention describes a method of forming a crystal film on a substrate. A substrate is provided having a surface in readiness for forming a high-K dielectric thereon. A crystalline film is formed using an ion beam assisted grain orientation control process thereby forming the crystalline film with substantial crystallographic alignment in at least two lattice axes of the crystalline film.

In one another embodiment, a method embodiment for forming a high-K dielectric film on a semiconductor substrate is disclosed. A substrate is provided a high-K film is formed using a deposition process in conjunction with an ion beam assisted grain orientation control process to form the high-K dielectric film wherein the ion beam assisted grain orientation control process includes bombarding the substrate with ions from an ion beam directed onto the substrate at a specified bombardment angle.

In one another embodiment, a method embodiment for forming a high-K dielectric film on a semiconductor substrate is disclosed. A substrate is provided a high-K film is formed using an angular deposition process in which at deposited materials are deposited onto the substrate at a deposition angle chosen such that the resultant high-K dielectric film is formed with a high degree of crystallographic alignment at grain boundaries of the resulting dielectric film.

These and other features and advantages of the present invention are described below with reference to the drawings.

BRIEF DESCRIPTION OF THE DRAWINGS

The following detailed description will be more readily understood in conjunction with the accompanying drawings, in which:

FIGS. 1(a) and 1(b) are simplified cross-section and top views of a semiconductor substrate that schematically illustrate the problems caused by crystallographic misalignment at the grain boundary of a high-K dielectric layer.

FIG. 2 schematically depicts a crystallographic reference system used to describe the invention.

FIG. 3 schematically depicts a perfectly aligned crystal lattice. crystallographic reference system used to describe the invention.

FIG. 4 schematically depicts a misaligned crystal.

FIGS. 5(a)-5(c) are simplified views of a high-K dielectric layer having substantial biaxial alignment at a grain boundary in accordance with the principles of the invention.

FIG. 6 is a simplified schematic depiction of an apparatus embodiment suitable for performing ion beam assisted deposition leading to substantial biaxial alignment at a grain boundary of a high-K dielectric layer in accordance with the principles of the invention.

FIGS. 7(a)-7(c) are simplified schematic depictions of crystal structures showing bombardment axes and showing lines of higher and lower atomic density in accordance with the principles of the invention.

FIG. 8 is a simplified schematic depiction of another apparatus embodiment suitable for performing angularly directed deposition leading to substantial biaxial alignment of the grains of a high-K dielectric layer in accordance with the principles of the invention.

FIG. 9 is a simplified schematic depiction of a transistor embodiment suitable constructed in accordance with the principles of the invention.

It is to be understood that, in the drawings, like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, various materials and method embodiments for constructing high-K dielectric films will be disclosed.

The inventors, as well as others, have noted that crystalline high-K materials (e.g., $ZrO_2$) are formed having grain boundaries at the intersections between different crystal structures of a crystalline dielectric material. These grain boundaries are a naturally occurring by-product of many convention processes for making crystalline high-K dielectric layers. FIGS. 1(a) and 1(b) are simplified schematic depictions of an ordinary crystalline high-K dielectric layer. As is known to those having ordinary skill in the art crystalline structures comprise crystal lattices comprised on multitudes of individual crystals (or cells). Each of these cells have a characteristic three dimensional crystallographic structure (the shape of which can vary depending on the component materials). Common cell structures being cubic (body or face centered), hexagonal, monoclinic, orthorhombic, rhombohedral, tetragonal, etc. Of course many other intermediate cell structures are possible. Crystal lattices are structures formed of many commonly oriented crystal cells. A perfect dielectric crystal film would comprise a single crystal lattice structure across the entire film. As it turns out such films are very difficult and very expensive to produce. Additionally, as is known to those having ordinary skill in the art, conventional high-K dielectric films are typically formed having many different crystal lattices formed in the film. The three dimensional orientations of the various crystal lattices (also commonly referred to as the lattice grain or the lattice grain structure) of a typical film are commonly quite different from each other. The portions of a crystal film where the lattices of two (or more) non-aligned crystal lattice structure intersect are referred to as grain boundaries.

Referring to the simplified schematic views of FIGS. 1(a) and 1(b) a conventional crystalline high-K dielectric film 101 is depicted on a substrate 102 (for example, a silicon wafer). As can be seen, a c-axis of a first crystal lattice 101a is not aligned with a c-axis of a second crystal lattice 101b of the film 101. This lack of three-dimensional crystallographic alignment leads to a grain boundary 103 formed at the intersection of the two lattice structures 101a and 101b. Moreover, as seen in FIG. 1(b) the crystallographic misalignment can extend in many dimensions. These grain boundaries are defects that provide avenues for charge hopping, tunneling, and trapping. In short they lead to the formation of unwanted conduction paths through the dielectric films 101. One example of a conduction path 104 is depicted in FIG. 1(a).

It would be advantageous to eliminate or reduce the effect of the aforementioned grain boundary defects. Current solutions to this problem involve using amorphous medium-K dielectrics to form gate dielectrics. This of course requires thinner gates and therefore greater potential for current leakage. This problem becomes especially acute for critical dimensions below 65 nm. Additionally, dopants (e.g., N) can be introduced into the grains and grain boundaries of the lattices. However, this solution has provided only limited utility and is found especially wanting for critical dimensions below 45 nm. Thus, as critical dimensions continue to shrink present solutions are unsatisfactory.

FIG. 2 depicts an example crystal lattice cell 201 and associated a, b, and c coordinate axes that can be used to define three-dimensional orientation in crystal cell or crystal lattice. FIG. 3 depicts an example of a plurality of crystal cells 201 aligned in a crystal lattice 301. The c-axes of some of the crystal cells are also depicted. FIG. 4 depicts unaligned crystals (or grains) 401, 402 and a grain boundary 403.

The inventors have determined that by achieving a substantial degree of alignment between the crystal lattice axes of the grains in high-K dielectric film a substantial reduction in leakage current can be achieved. Moreover, because the degree of alignment between the crystal lattices (grains) need not be perfect there is no need to form such films or layers in a single crystalline fashion. Thus, the inventors can achieve a substantial increase in electrical performance without reliance on time consuming and expensive epitaxial growth schemes.

One embodiment of a crystalline high-K dielectric film fabricated in accordance with the principles of the invention is depicted in FIGS. 5(a)-5(c). FIG. 5(a) is a simplified schematic cross-section view of one embodiment of a crystalline high-K dielectric film 501 constructed in accordance with the principles of the invention. In the depicted embodiment, two schematically depicted grains (crystals) 502, 503 are shown formed on a substrate 504 (e.g., a silicon wafer or other suitable substrate (GaAs, doped silicon, and so on)). The lines in each grain schematically depict rows of orderly packed atoms associated with certain packing planes. A grain boundary 505 still exists between the two grains, but due to a high degree of crystallographic alignment at the grain boundary 505 of the dielectric film 501 the effects of the grain boundary is significantly ameliorated. In the depicted embodiment, the c-axis ($C_1$) of a first grain 503 is substantially aligned with the c-axis ($C_2$) of second grain 502. Both of the depicted c-axes are substantially normal to the surface plane of the substrate 504. Although the c-axes are depicted here as being substantially normal to the surface plane, the inventors contemplate that the c-axes of the crystal lattices can be in any direction.

The important consideration being that the c-axes of the crystal lattices are substantially aligned with each other. With reference to FIG. 5(b), a simplified schematic plan view of FIG. 5(a) is depicted. Again FIG. 5(b) is a representation of a crystalline high-K dielectric film 501 constructed in accordance with the principles of the invention. In the depicted embodiment, the two schematically depicted grains 502, 503 are shown. The grain boundary 505 can also be seen, although from a different point of view. However, the in accordance with the principles of the invention crystallography alignment is also present in this plane. The circled area 506 is depicted (in part) in FIG. 5(c). FIG. 5(c) shows the high degree of crystallographic alignment at the grain boundary 505 between the two grains 502, 503. This means that the crystal axes of the grains are substantially aligned with each other at the grain boundary 505. This is schematically depicted by orientation of the lattice axes (e.g., b-axes) of the two grains (502, 503) at the grain boundary. Such high degree of crystallographic alignment means that the lattice axes are aligned to within about 0° to about 15° of each other. Additional performance improvements can be noted when the axes are aligned to within about 0° to about 5° from each other. More commonly, alignment between lattice axes is achieved in the range of about 1° to about 15° or more narrowly in the range of about 1° to about 5°. Moreover, the grain alignment yields best results when the grain structures are bi-axially aligned at the grain boundary. For example, the c-axis of a first crystal lattice is aligned to within about 1° to about 15° of the c-axis of a second crystal lattice. Additionally, such bi-axial alignment requires that a second axis (e.g., the a-axis) also be substantially aligned. For example, the a-axis of the first crystal lattice is aligned to within about 1° to about 15° of the a-axis of the second crystal lattice. Many different materials can be used to form such substantially bi-axially aligned crystalline high-K dielectric films. Representative, example materials include but are not limited to $ZrO_2$, $ZrSiON$, $HfO$, $HfO_2$, $HfSiON$, $HfON$, $CeO_2$, $Dy_2O_3$, $SmO$, $Sm_2O_3$, $MgO$, $Y_2O_3$, $Pr_2O_3$, $Al_2O_3$, $La_2O_3$, $Na_2O_3$, $Eu_2O_3$, $Gd_2O_3$, $Tb_2O_3$, $Ho_2O_3$, $Er_2O_3$, $Tm_2O_3$, $Yb_2O_3$, $Lu_2O_3$ and $Hf_{0.74}Yb_{0.26}O_{1.8}$. It is important to note that such materials can comprise any subgroup of these materials. As is known to persons of ordinary skill, many other suitable materials can be used. Such a structure delivers very much improved leakage performance while still providing an excellent high-K layer.

Heretofore applied manufacturing approaches cannot cost effectively manufacture such substantially bi-axially aligned high-K dielectric layers in a time efficient manner. The inventors have invented several manufacturing processes which can be successfully used to fabricate such layers. The following paragraphs depict two illustrative examples of suitable manufacturing process embodiments.

In one manufacturing approach, an ion beam assisted deposition process can be used. This process can be explained in conjunction with FIG. 6. FIG. 6 provides a simplified schematic depiction of a suitable high-K deposition chamber 600 in accordance with the principles of the invention. Such a chamber is generally similar to any one of many different deposition chambers known to those having ordinary skill in the art. Here a chamber suitable for sputter deposition is chosen. The chamber is either a vacuum chamber or filled with some material suitable for assisting in the deposition of the desired dielectric film or suitable for forming a desired precursor material. A first ion beam generator 601 generates a first ion beam 602 that is directed onto a precursor substrate 603. In one example, the ion beam can be Ar ions. Many other materials can be selected to optimize process results. Bombardment by the first ion beam 602 generates a "plume" of dislodged material 603a from the substrate 603. The presence of an electromagnetic field directs the dislodged material 603a downward onto a deposition substrate 604 (e.g., a silicon wafer) onto which the material is to be deposited. In one embodiment, during deposition, a secondary ion beam 605 (produced, for example, by a second ion beam generator 606) is directed onto the deposition substrate 604. The inventors have discovered that by correctly choosing the "bombardment angle" 607 a substantially bi-axially aligned high-K dielectric film can be formed on the substrate 604. This is the essence of an ion beam assisted grain orientation control process used to form lattice structures have a substantially aligned crystallographic axes. Such bi-axially aligned films are said to have substantially aligned crystallographic structures. Thus, this method embodiment forms substantially bi-axially aligned high-K dielectric film on a substrate by providing a suitable substrate (for example, a semiconductor substrate) and then employing a deposition process in conjunction with an ion beam assisted grain orientation control process to form the high-K dielectric film by bombarding the substrate with ions from an ion beam directed onto the substrate at a specified bombardment angle that results in the formation of a crystalline high-K dielectric film having substantial crystallographic alignment at grain boundaries formed in the film. Such processes can be used as part of an atomic layer deposition (ALD) process, a metal organic chemical vapor deposition (MOCVD) process, a physical vapor deposition (PVD) process, or a plasma-enhanced chemical vapor deposition (PECVD) process. Also, low pressure CVD processes, evaporation processes, laser ablation processes, molecular beam CVD (ECVD) process, and molecular beam epitaxy (MBE) processes can be used.

In one example, process a zirconium target can be sputtered by an argon ion beam in a vacuum chamber environment at temperatures between room temperature and about 500 C.° for a time in the range of about 5 to 500 s (seconds) to deposit a layer about 50 Å thick. A secondary ion beam can be directed onto the substrate at an angle 607 of about 35° from the plane of the substrate 604 in order to preferentially emphasize the formation of crystal lattice structures having the desired bi-axially crystallographic orientation thereby resulting in a substantially bi-axially aligned high-K dielectric film. Such films can be formed to a thickness of about 20 to about 2000 Å thick.

In another alternative approach, the target 603 can be sputtered by an ion beam 602 in a desired vacuum chamber environment to deposit a layer material (for example, a high-K precursor material) on the substrate 604. The secondary ion beam 605 is not used during deposition at this time. Once a layer material (again for example, a high-K precursor material) is formed to a desired thickness (e.g., an average thickness in the range of about 0.5 to about 6 Å) the secondary ion beam 605 is then directed onto the substrate at a bombardment angle 607 chosen to preferentially emphasize the formation of crystal lattice structures (e.g., grains) having the desired bi-axially crystallographic orientation for the deposited material. Also, the deposited materials may need to be reacted with other materials to obtain the desired dielectric layer chemistry. Depending on the material or the needs or the process engineer, the ion beam can be directed onto the substrate either before or after the reaction. The thickness of these layers is commonly chosen to be such that a subsequent angular bombardment operation can erode the entire new layer leaving a desired bi-axial crystallographic orientation for the newly deposited material (thus, it can be seen that, depending on the deposited material and the type of bombardment ions, different thicknesses (even greater than 6 Å) can be used in forming the layers). As hinted at above, the new layer is bombarded with the angularly directed second ion beam to obtain a substantially bi-axially aligned high-K dielectric film. Alternating operations of deposition and angular bombardment can be continued until a high-K dielectric film having the desired thickness is formed. Such alternative deposition and angular bombardment processes can be employed with particular effectiveness in ALD processes.

The above discussion addresses a few possible embodiments of an ion beam assisted grain orientation control process in accordance with the principles of the invention. The bombardment process itself is largely dependent on the crystallographic structure of the high-K dielectric material forming the layers onto which the bombardment is directed. The specified bombardment angle is associated with the crystallographic lattice structure of the low-K dielectric material.

Referring to FIG. 7(a), and using for example, a zirconium oxide crystal structure 700, which has a face centered cubic structure as well as a number of interstitial oxygen atoms, crystallographic analysis can be used to determine that a bombardment axis (or bombardment angle) 705 having a high atomic packing density. The packing patterns of atoms in a lattice are dictated by two factors: the tendency of atoms to come close together due to attractive inter-atomic forces and the need to maintain bonding angles specific to each atomic species. Consequently, the packing density of atoms (e.g. atoms per unit volume, unit area, or line segment) in a lattice is dependent on crystallographic orientation. Thus, certain lines (angles) through a crystal are characterized by a higher atomic density than other lines through the crystal. Preferably, bombardment angles are chosen to pass through crystals at an angle having higher atomic densities than other angles in order to preferentially erode non-aligned atomic nuclei. In the embodiment depicted in FIG. 7(a), a bombardment axis 705 having a high atomic packing density is defined by the line between (0,0,0) 701 and (1,1,1) 702. In comparison, a line between (1,0,1) 706 and (1,1,1) 702 defines a bombardment axis having a relatively lower atomic packing density. In the depicted embodiment, a preferred bombardment axis 705 defines an angle ($\phi$) 704 of about 35°. Bombardment at this angle 704 preferentially erodes atoms not in line with the bombardment axis 705 (i.e., an angle associated with a high atomic packing density). This line represents one of a number of bombardment axes characterized by a high atomic packing density for the depicted crystal structure.

Referring, for example, to FIG. 7(b), a face centered cubic crystallographic structure 710 is depicted. The diagonal line 711 passing across the face of the face centered cubic structure, for example, passes through 3 atomic nuclei and therefore has a higher atomic packing density than a line 712 passing through only two nuclei. Thus, a bombardment axis along 712 has a relatively low atomic packing density and is generally not preferred.

In an additional example, FIG. 7(c) depicts a simplified illustration of an orthorhombic lattice 720. The first line 721 passes along a "short" lattice axis and a second line 722 passes through a "long" lattice axis. Accordingly, line 721 has a higher atomic packing density than a line 722. Thus, in this very simplified illustration of the general principle, a bombardment axis along 721 has a relatively high atomic packing density and is generally preferred.

Thus, when a bombardment angle is correctly chosen, atoms that are not crystallographically aligned with the lattice have a tendency to be more easily eroded by the angularly directed ion beam. Whereas, the atoms that are in alignment with the crystal lattice structure demonstrate a greater resistance to erosion by the angularly directed bombardment. Thus, the angle of bombardment can be used to choose the crystal structure of the resultant film by the preferential erosion of non-aligned atomic nuclei. This is believed to work because the crystallographically aligned nuclei (those nuclei being align along the axis of greatest atomic density) are more resistant to erosion. Thus, by correctly choosing a bombardment angle associated with a high degree of atomic density for the specified crystalline structure, a resulting lattice can be formed having a desired crystallographic orientation thereby promoting the formation of crystalline structures having a high degree of grain alignment at the grain boundaries (i.e., substantial bi-axial alignment of the lattices).

In one manufacturing approach, an angularly directed deposition process can be used. This process can be explained in conjunction with FIG. 8. FIG. 8 provides a simplified schematic depiction of a suitable high-K dielectric deposition chamber 800 in accordance with the principles of the invention. Such a chamber is generally similar to any one of many different deposition chambers known to those having ordinary skill in the art. Here a chamber suitable for sputter deposition is chosen. The chamber is either a vacuum chamber or filled with some material suitable for assisting in the deposition of the desired dielectric film or suitable for forming a desired precursor material. An ion beam generator 801 generates an ion beam 802 that is directed onto a precursor substrate 803. In one example, the ion beam can be Ar ions. Many other bombardment ions can be selected to optimize process results. Bombardment by the ion beam 802 generates a "plume" of dislodged material 803a from the substrate 803. The presence of an electromagnetic field directs the dislodged material 803a downward onto a deposition substrate 804 (e.g., a silicon wafer) onto which the material is to be deposited. In this embodiment, the deposition substrate 804 is angularly oriented relative to the bombardment path taken by the ions from the target 803. This deposition angle 807 corresponds to the bombardment angle 607 discussed above, for example, with respect to FIG. 6. The inventors have discovered that by correctly choosing the "deposition angle" 807 a substantially bi-axially aligned high-K dielectric film can be formed on the substrate 804. This improves the control of grain orientation in the resultant high-K dielectric film formed on the substrate 804. Thus, angular deposition of the type described here operates as a grain orientation control process used to form lattice structures (e.g., grains and crystals) that have a substantially aligned crystallographic axes. As described above, such bi-axially aligned films are said to have substantially aligned crystallographic structures. Thus, this method embodiment forms substantially bi-axially aligned high-K dielectric film on a substrate 804 by providing a suitable substrate (for example, a semiconductor substrate) and then employing an angular deposition process to form a high-K dielectric film having substantial crystallographic alignment at grain boundaries formed in the film. Such processes can be used as part of a physical vapor deposition (PVD) process, a plasma-enhanced chemical vapor deposition (PECVD) process, or any sputter deposition process.

In one example, process a zirconium target 803 can be sputtered by an argon ion beam 802 in a vacuum chamber environment at temperatures between room temperature and about 500 C.° for times in the range of about 5 s to about 500 s to deposit a layer of about 50 Å thick. The plume of sputtered zirconium ions can be directed onto the substrate 804 at an angle 807 of about 35° from the plane of the substrate 804 in order to preferentially emphasize the formation of crystal lattice structures having the desired bi-axially crystallographic orientation thereby resulting in a substantially bi-axially aligned high-K dielectric film. Generally, this is achieved by inclining the substrate 804 at the desired angle to the incoming zirconium ions sputtered from the target 803. Such films can be formed to a thickness of about 20-2000 Å thick.

Many different solid state circuit structures can make use of the high-K dielectric film fabricated in accordance with the principles of the invention. FIG. 9 depicts one such structure. FIG. 9 depicts a CMOS transistor 900 formed in accordance with the principles of the invention. Such embodiments begin by first providing a suitable substrate 901. As used herein, substrate refers to a semiconductor structure. Such structures can include, for example, a silicon or GaAs wafer and the like. Such substrates 901 can be doped if needed (for example, where n-well and p-well transistors are to be formed). The depicted substrate 901 includes a typical transistor 900 formed thereon. The transistor 90 is generally isolated from other transistors and circuit structures on the wafer using isolation structures (not shown in this view). Source 902 and drain 903 regions can be formed in the substrate 901, as can an associated channel region 904. A gate dielectric layer 911 can be formed in accordance with the principles of the invention. The remainder of the gate stack 912 is formed. Such gate stack 912 is typically a multi-layer structure formed of layers of silicon dioxides, polysilicon, as well as other materials. Such gate structures are well known and any suitable configuration can be employed in accordance with the principles of the invention. Methods suitable for forming such gate stacks are well known to those of ordinary skill and need not be discussed here. A gate contact 913 can also be formed on top of the stack 912. Commonly the gate contact 913 is formed of a material having good electrical conduction properties as well as good adhesion properties to the gate materials (and any subsequently formed electrical connections). One suitable family of materials are referred to as "silicon intermetallic materials". Examples of such materials include nickel silicides and cobalt silicides. Other suitable materials can be used. Also, the gate commonly has spacers 905 arranged on the sides to enhance electrical performance. One typical spacer material is $SiO_2$. Those of ordinary skill in the art will also appreciate that the substantially bi-axially aligned high-K dielectric layer 911 disclosed herein can be employed in many other application beyond gate stack implementations The present invention has been particularly shown and described with respect to certain embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Further, reference in the claims to an element in the singular is not intended to mean "one and only one" unless explicitly stated, but rather, "one or more".

What is claimed is:

1. An integrated circuit structure comprising: a substrate comprising a semiconductor material having a dielectric layer formed on semiconductor material of the substrate, the dielectric layer comprising a high-K dielectric film having grain boundaries with a high degree of crystallographic alignment at grain boundaries of the dielectric film wherein the grain misalignments at the grain boundaries are in the range of about 1 to about 15 degrees wherein the high-K dielectric film comprises layers of at least one of: $ZrO_2$, ZrSiON, HfO, HfSiON, HfON, SmO, $Al_2O_3$, $Na_2O_3$, and $Hf_{0.74}Yb_{0.26}O_{1.8}$.

2. The integrated circuit structure of claim 1 wherein the high degree of crystallographic alignment at the grain boundaries is defined by grain misalignments in the range of 1 to about 5 degrees.

3. The integrated circuit structure of claim 1 wherein the high-K dielectric film comprises layers of at least one of: $ZrO_2$, SmO, HfO, $Al_2O_3$, and $Hf_{0.74}Yb_{0.26}O_{1.8}$.

4. The integrated circuit structure of claim 1 wherein crystal lattice structures that comprise the high-K dielectric film define a plurality of crystal structures having grain boundaries at the interface between said crystal structures and wherein an axis of each crystal structure is normal to a top surface of said semiconductor material and whereby said crystal structures are in substantial bi-axial alignment at said grain boundaries.

5. The integrated circuit structure of claim 4 wherein the crystallographic alignment at the grain boundaries is characterized by substantial crystallographic alignment in at least two crystallographic axes of the dielectric film.

6. The integrated circuit structure of claim 1 wherein the high-K dielectric film comprises a layer of at least $Hf_{0.74}Yb_{0.26}O_{1.8}$.

7. The integrated circuit structure of claim 1 wherein the high degree of crystallographic alignment at the grain boundaries is defined by a grain misalignment between crystal structures on either side of the grain boundary wherein the misalignment between the crystal structures is in the range of 1 to 15 degrees.

8. A transistor comprising:
a channel region between a source region and a drain region wherein the channel, source, and drain regions each comprise semiconductor material;
a gate stack disposed on the channel region between the source region and the drain region wherein the bottom of the stack includes a gate dielectric layer disposed on the channel region, the gate dielectric layer comprising a high-K dielectric film having a first crystal lattice structure defining a first grain and a second crystal lattice structure defining a second grain, the lattice structures defining an associated grain boundary at the intersection of the first and second grains and wherein at least two axes of the first grain are aligned to within 1 degree to about 15 degrees of corresponding axes of the second grain at the associated grain boundary; and
a gate electrode coupled to the gate stack.

9. The transistor of claim 8 wherein the at least two axes of the first grain are aligned to within about 1 to about 5 degrees of corresponding axes of the second grain at the associated grain boundary.

10. The transistor of claim 8,
wherein the channel, source, and drain regions each comprise semiconductor material; and
wherein the high-K dielectric film comprises at least one of: $ZrO_2$, SmO, HfO, $Al_2O_3$, and $Hf_{0.74}Yb_{0.26}O_{1.8}$.

11. An integrated circuit structure as in claim 8 wherein the first crystallographic structure and the second crystallographic structure each have one crystallographic axis that is oriented normal to a top surface of the gate region such that the grain boundaries of the are aligned to within
1 to about 15 degrees.

12. A transistor comprising:
a channel region between a source region and a drain region;
a gate stack disposed in the channel region between the source region and the drain region wherein the channel, source, and drain regions comprise a semiconductor material and wherein the bottom of the stack includes a gate dielectric layer disposed on the channel region, the gate dielectric layer comprising a high-K dielectric film having a first crystal lattice structure defining a first grain and a second crystal lattice structure defining a second grain, the lattice structures defining an associated grain boundary at the intersection of the first and second grains and wherein there is at least some degree of misalignment at the grain boundary wherein the misalignment between the first and second grains is in the range of greater than zero degrees to about 15 degrees and wherein the high-K dielectric film comprises a material selected from the group of $ZrO_2$, ZrSiON, HfO, HfSiON, HfON, SmO, $Al_2O_3$, $Na_2O_3$, and $Hf_{0.74}Yb_{0.26}O_{1.8}$; and a gate electrode coupled to the gate stack.

13. The transistor of claim 12 wherein the high-K dielectric film comprises at least one of: $ZrO_2$, HfO, and $Al_2O_3$,..

14. The transistor of claim 12 wherein the grains of the high-K dielectric film include a, b, and c axes and wherein the c axes of the first and second grains are substantially parallel to each other.

15. The transistor of claim 12 wherein the grains of the high-K dielectric film include a, b, and c axes and wherein the c axes of the first and second grains are normal to a top surface of the channel region.

16. The transistor of claim 12 wherein the semiconductor material of the channel, source, and drain regions consists of materials selected from among silicon material or doped silicon material.

* * * * *